United States Patent
Mizuguchi et al.

(10) Patent No.: US 7,145,494 B2
(45) Date of Patent: Dec. 5, 2006

(54) DIFFERENTIAL COMPARATOR, ANALOG/DIGITAL CONVERSION APPARATUS AND IMAGING APPARATUS

(75) Inventors: Toshitaka Mizuguchi, Kawasaki (JP); Jun Funakoshi, Kawasaki (JP); Seiji Yamagata, Kawasaki (JP); Tsuyoshi Higuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/008,292

(22) Filed: Dec. 10, 2004

(65) Prior Publication Data

US 2006/0001750 A1    Jan. 5, 2006

(30) Foreign Application Priority Data

Jul. 2, 2004 (JP) .............................. 2004-197329

(51) Int. Cl.
H03M 1/12 (2006.01)
(52) U.S. Cl. ..................................... 341/155
(58) Field of Classification Search ................ 341/155, 341/164, 165, 158; 327/77, 337, 65; 330/9
See application file for complete search history.

(56) References Cited

U.S. PATENT DOCUMENTS 4,899,068 A * 2/1990 Klose et al. .................. 327/89
5,032,744 A * 7/1991 Wai Yeung Liu .............. 327/55
5,332,931 A * 7/1994 Crispie et al. ................ 327/67
2005/0052308 A1    3/2005 Suzuki et al.

FOREIGN PATENT DOCUMENTS

| JP | 2000-261602 | 9/2000 |
|---|---|---|
| JP | 2000-286706 | 10/2000 |
| JP | 2000-287137 | 10/2000 |
| JP | 2002-218324 | 8/2002 |
| KR | 2003-91817 | 12/2003 |

* cited by examiner

Primary Examiner—Brian Young
(74) Attorney, Agent, or Firm—Arent Fox PLLC

(57) ABSTRACT

A differential comparator which outputs positive and/or negative logic signals to an output terminal according to the coincidence/non-coincidence of first and second input signal levels inputted to first and second input terminals, respectively, comprises an offset cancel function composed of an offset capacitor device provided on the differential comparator side of the first and second terminals, a first switch for short-circuiting the first and second input terminals in such a way as to form a closed loop including the offset capacitor device, and a second switch for short-circuiting both the connection point between the offset capacitor device and the differential comparator, and the output terminal.

14 Claims, 6 Drawing Sheets

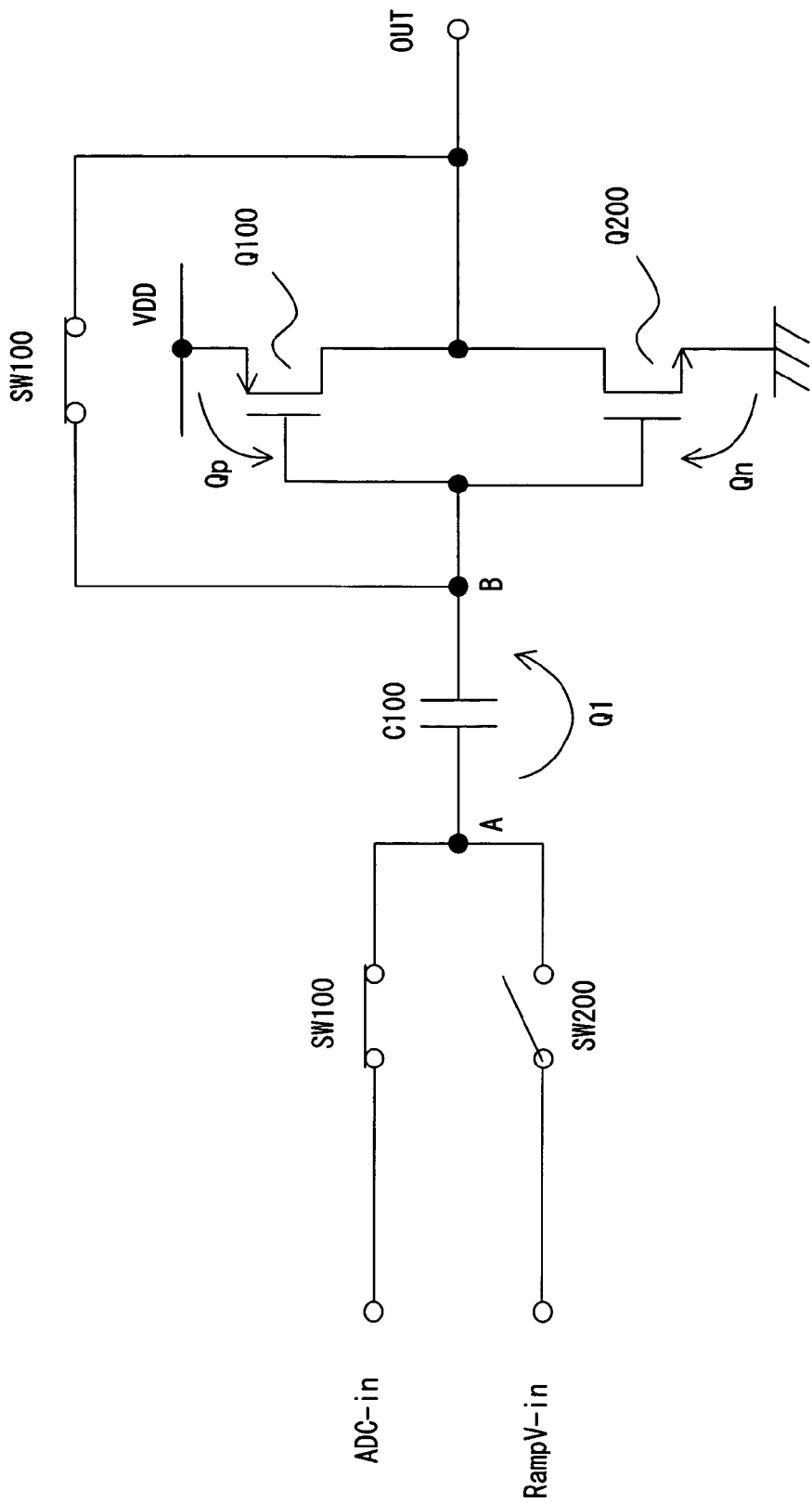
F I G. 2

DIFFERENTIAL COMPARATOR, ANALOG/DIGITAL CONVERSION APPARATUS AND IMAGING APPARATUS

CROSS-REFERENCE TO RELATED APPLICATIONS

This application is based upon and claims the benefit of priority from Japanese Patent Application No. 2004-197329, filed in Jul. 2, 2004, the entire contents of which are incorporated herein by reference.

BACKGROUND OF THE INVENTION

1. Field of the Invention

The present invention relates to a differential comparator, an analog/digital conversion apparatus and an imaging apparatus, more particularly, to a technology effective when applied to the reading circuit of optical/electrical conversion signals in a complementary metal oxide semiconductor (CMOS) image sensor and the like.

2. Description of the Related Art

Attention is paid to a CMOS image sensor, for example, for the reason that the CMOS image sensor matches the manufacturing process, operating voltage and the like in surrounding image processing circuits, and that an imaging apparatus, an image processing circuit, a controller and the like can be easily integrated on one chip and the like, compared with, for example, a charge-coupled device (CCD) image sensor.

Since this CMOS image sensor amplifies not only a photoelectric conversion device but also a conversion signal at each pixel level, the CMOS image sensor is resistant to noise in the transmission process of a photoelectric conversion signal. However, its fixed pattern noise due to the unevenness in a characteristic among amplifiers at each pixel level is a problem.

For this reason, a configuration in which the same number of correlation double sampling (CDS) circuits and analog/digital conversion (ADC) circuits as the number of columns are disposed in series for each set of pixels in the column direction, of a plurality of pixels two-dimensionally arrayed in the orthogonal row and column directions, that is, a configuration in which the fixed pattern noise is reduced by a so-called column ADC method, is well known.

As the column ADC of the CMOS image sensor, for example, Patent Reference 1 discloses a technology for realizing fine color control for each color by selectively outputting a different analog comparison reference voltage for a pixel column ADC provided for each color filter of three primary colors of light. Specifically, the accuracy of digital conversion is attempted to improve by short-circuiting the input/output of a chopper type comparator using an inverter and shifting the reference voltage by the same as the shifted value of a threshold voltage, due to the parasitic capacitance of a transistor constituting the relevant inverter.

Patent Reference 2 discloses a technology for eliminating fixed pattern noise that can exist in pixels to improve image quality, by adding a capacitor on the ramp signal input side of a chopper type comparator in which an inverter is connected in double stages, storing offset voltage in the reset mode of a pixel and correcting the voltage of a ramp signal inputted in the counter mode by the offset voltage.

Patent Reference 3 discloses a technology for realizing a stable analog/digital conversion characteristic by shifting the reference voltage of an inverter constituting an AD converter and controlling so that a signal outputted from a pixel and the reference voltage may be compared if the relevant reference voltage has a linear characteristic.

Patent Reference 4 discloses a technology for preventing a direct current level from differing among a plurality of pixel reading signals to improve image quality, by providing a plurality of analog/digital converters, selecting the output of the plurality of analog/digital converters one after another, constituting a noise cancel (comparison) unit of a plurality of amplifiers composed of a differential amplifier and an inverter in a fixed imaging device for obtaining digital picture output and by providing amplifiers at the second stage and after with a clamp circuit.

However, any of the above-mentioned technologies of Patent References 1 through 4 does not recognize the following technical problems caused when the comparator of the analog/digital converter is composed of only an inverter, or an inverter and a differential amplifier.

Specifically, FIG. 1 is a block diagram showing the configuration of a chopper type comparator, which is the reference technology of the present invention. The chopper type comparator using an inverter A100 shown in FIG. 1 stores an analog signal in C100 when switches S100 and S100x are switched on, and compares the analog signal with reference voltage when S100 and S100x are turned off and S200 is turned on to determine the analog signal. However, there is at a point B a parasitic capacitor (C200), such as the gate capacitor of a transistor constituting the inverter A100 or the like. Therefore, if the reference voltage is inputted for comparison, the potential at a point A, point B attempts to transit to the potential of the amount of charge stored in C100 based on the potential at point A. However, since there is the parasitic capacitor C200, point B changes at a ratio between C100 and C200, and the accuracy of analog/digital conversion degrades, which is a technical problem.

Specifically, as shown in FIG. 2, in the inverter A100 of the CMOS imaging sensor, a p type MOS transistor Q100 and a n type MOS transistor Q200 (threshold value $V_{th}$) are provided in series between power supply VDD and grounding, and their respective gates and voltage between their sources are used as input and output (OUT), respectively. However, the parasitic capacitor $Q_p$ and $Q_n$ of Q100 and Q200, respectively, affect capacitor C100 on the input side. Therefore, for example, when SW100 and SW200 are turned off and on, respectively, and when RampV is inputted, the respective gate potential Q100 and Q200 fluctuates at a ratio of $V_{th}$-C100 (ADC-RampV)/(C100+$C_p$+$C_n$) and the accuracy of analog/digital conversion degrades.

In a configuration using an inverter, the consumption current of the inverter is high. More particularly, in a configuration where a lot of ADC is provided for each column, like column ADC in the CMOS image sensor, the total consumption current of the imaging device becomes very high. As the countermeasure, it may be considered to increase the respective gate length of Q100 and Q200 to suppress the consumption current. However, this is not preferable, since the respective parasitic capacitance $Q_p$ and $Q_n$ becomes far larger due to the increase of each gate area.

Patent Reference 1: Japanese Patent Application Laid-open No. 2000-261602

Patent Reference 2: Japanese Patent Application Laid-open No. 2002-218324

Patent Reference 3: Japanese Patent Application Laid-open No. 2000-286706

Patent Reference 4: Japanese Patent Application Laid-open No. 2000-287137

SUMMARY OF THE INVENTION

It is an object of the present invention to provide a differential comparator capable of realizing highly accurate analog/digital conversion with the lesser amount of consumption current.

It is another object of the present invention to provide an analog/digital converter apparatus capable of realizing highly accurate analog/digital conversion with the lesser amount of consumption current.

It is another object of the present invention to provide an imaging apparatus capable of outputting high quality picture data with the lesser amount of consumption current.

The first aspect of the present invention is a differential comparator which outputs positive and/or negative logic signals to an output terminal according to the coincidence/non-coincidence of first and second input signal levels inputted to first and second input terminals, respectively.

The differential comparator comprises an offset cancel function composed of an offset capacitor device provided on the differential comparator side of the first and second terminals, a first switch for short-circuiting the first and second input terminals in such a way as to form a closed loop including the offset capacitor device, and a second switch for short-circuiting both the connection point between the offset capacitor device and the differential comparator, and the output terminal.

The second aspect of the present invention is an analog/digital converter apparatus which comprises a differential comparator which outputs positive and/or negative logic signal to an output terminal according to the coincidence/non-coincidence of the respective signal levels of an analog signal and a reference signal inputted to first and second input terminals, respectively, and a counter whose start and stoppage is controlled by the logic signal. The analog/digital converter apparatus outputs a value counted by a counter from when an analog signal is inputted as a trigger until the analog signal coincides with a reference signal.

The differential comparator comprises an offset cancel function composed of an offset capacitor device provided on the differential comparator side of the first and second terminals, a first switch for short-circuiting the first and second input terminals in such a way as to form a closed loop including the offset capacitor device, and a second switch for short-circuiting both the connection point between the offset capacitor device and the differential comparator, and the output terminal.

The third aspect of the present invention is an imaging apparatus which comprises reading circuits each composed of a pixel array, a plurality of pixel units of which, including an photoelectric conversion device are two-dimensionally arrayed in the row and column directions, and an analog/digital converter for converting an optical/electrical conversion signal outputted from each pixel unit into a digital signal.

The analog/digital converter comprises a differential comparator which outputs positive and/or negative logic signal to an output terminal according to the coincidence/non-coincidence of the respective signal levels of the photoelectric conversion signal and reference signal inputted to first and second input terminals, respectively, and an offset cancel function composed of an offset capacitor device provided on the differential comparator side of the first and second terminals, a first switch for short-circuiting the first and second input terminals in such a way as to form a closed loop including the offset capacitor device, and a second switch for short-circuiting both the output terminal and the first input terminal provided with the offset capacitor device.

According to the first and second aspects of the present invention, a capacitor device for signal is connected to the first input terminal to which an analog signal is inputted as a first input signal. At the same time an analog signal is inputted to this first input terminal, the first and second switches of the offset cancel function are closed, and the offset voltage of the differential comparator is stored in the offset capacitor device. Then, the first and second switches are opened. Then, when inputting a reference signal, such as a ramp waveform signal or the like, to the second input terminal as a second input signal and comparing the analog signal on the first input terminal with the reference signal, potential on the first input terminal side to which the analog signal stored in the capacitor device for signal is inputted is made constant by the offset voltage stored in the offset capacitor device. Therefore, the level of the inputted analog signal is not fluctuated by the parasitic capacitance or the like, unlike when using an inverter, and the analog signal can be accurately compared with the ramp waveform signal. Accordingly, the digitalization accuracy of an analog signal based on the relevant comparison can be improved.

In the differential comparator, since the respective comparison operations of the first and second input terminals do not depend on the amount of current, consumption current can be suppressed without increasing parasitic capacitance, and accordingly, a highly accurate analog/digital conversion process can be performed with the less amount of consumption current.

According to the third aspect of the present invention, by constituting an analog/digital converter provided for the optical/electrical conversion signal reading circuit of an imaging apparatus of a differential comparator and by providing an offset cancel function, the digitization process of photoelectric conversion signals can be performed using a reference signal, such as a ramp waveform signal or the like, and accordingly, obtained image quality can be improved.

Since the differential comparator can suppress consumption current without increasing parasitic capacitance, the suppression effect of consumption current is great in a configuration where a lot of analog/digital converters are disposed, such as a case where analog/digital converters are provided for each column of a plurality of pixel units in the CMOS image sensor, as in column ADC.

BRIEF DESCRIPTION OF THE DRAWINGS

FIG. 2 is a circuit diagram showing the internal composition of the chopper type comparator which is the reference technology of the present invention;

DESCRIPTION OF THE PREFERRED EMBODIMENT

The preferred embodiment of the present invention is described below with reference to the drawings.

Figure 1:
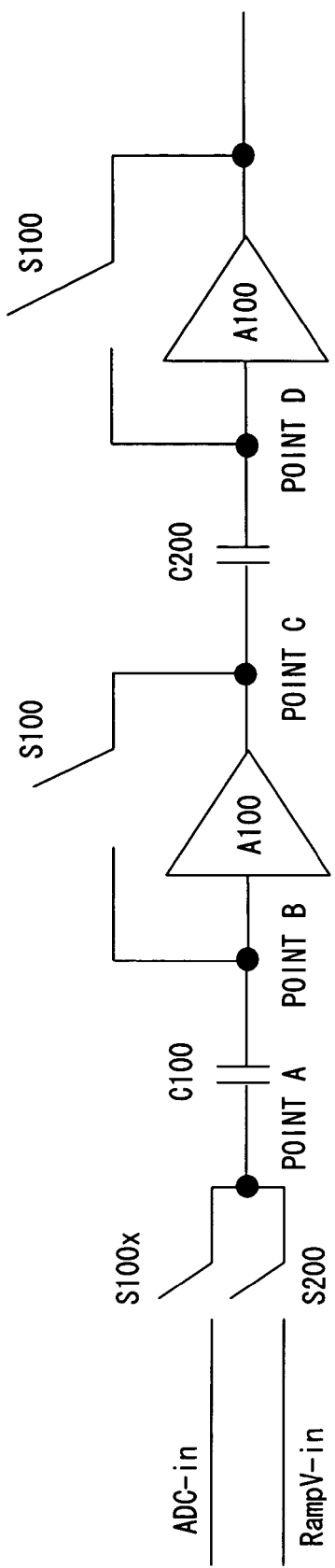
FIG. 1 is a block diagram showing the configuration of a chopper type comparator which is the reference technology of the present invention.
Figure 3:
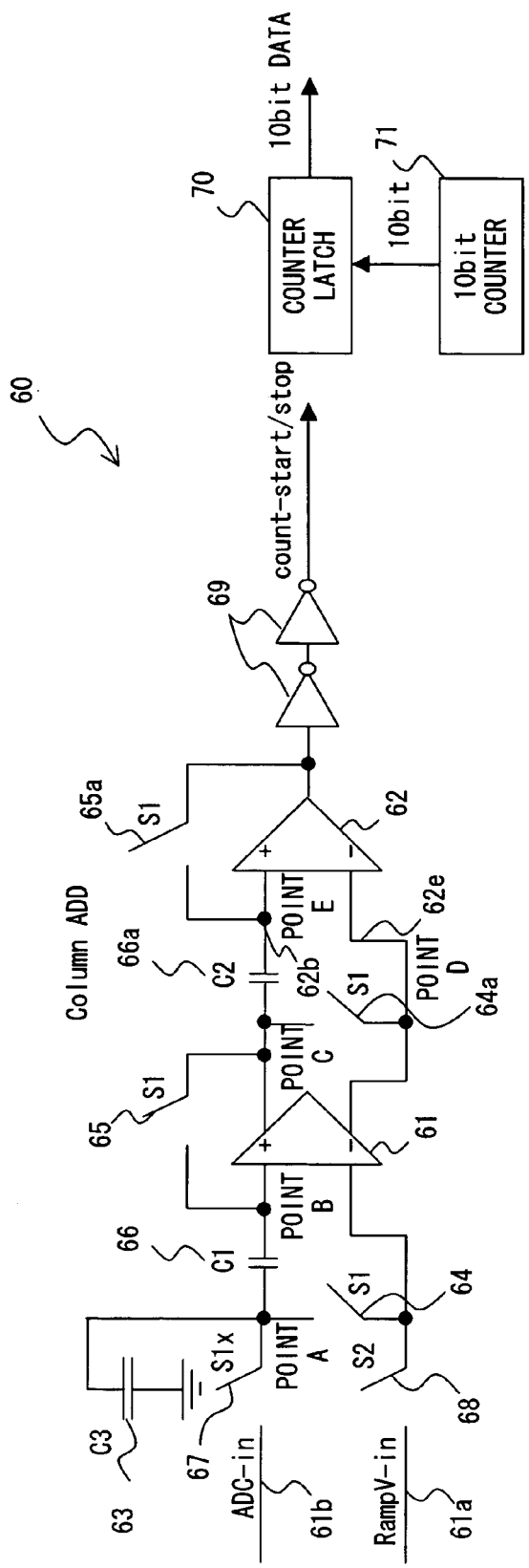
FIG. 3 is a block diagram showing one configuration of an analog/digital converter apparatus including the differential comparator which is one preferred embodiment of the present invention.
Figure 4:
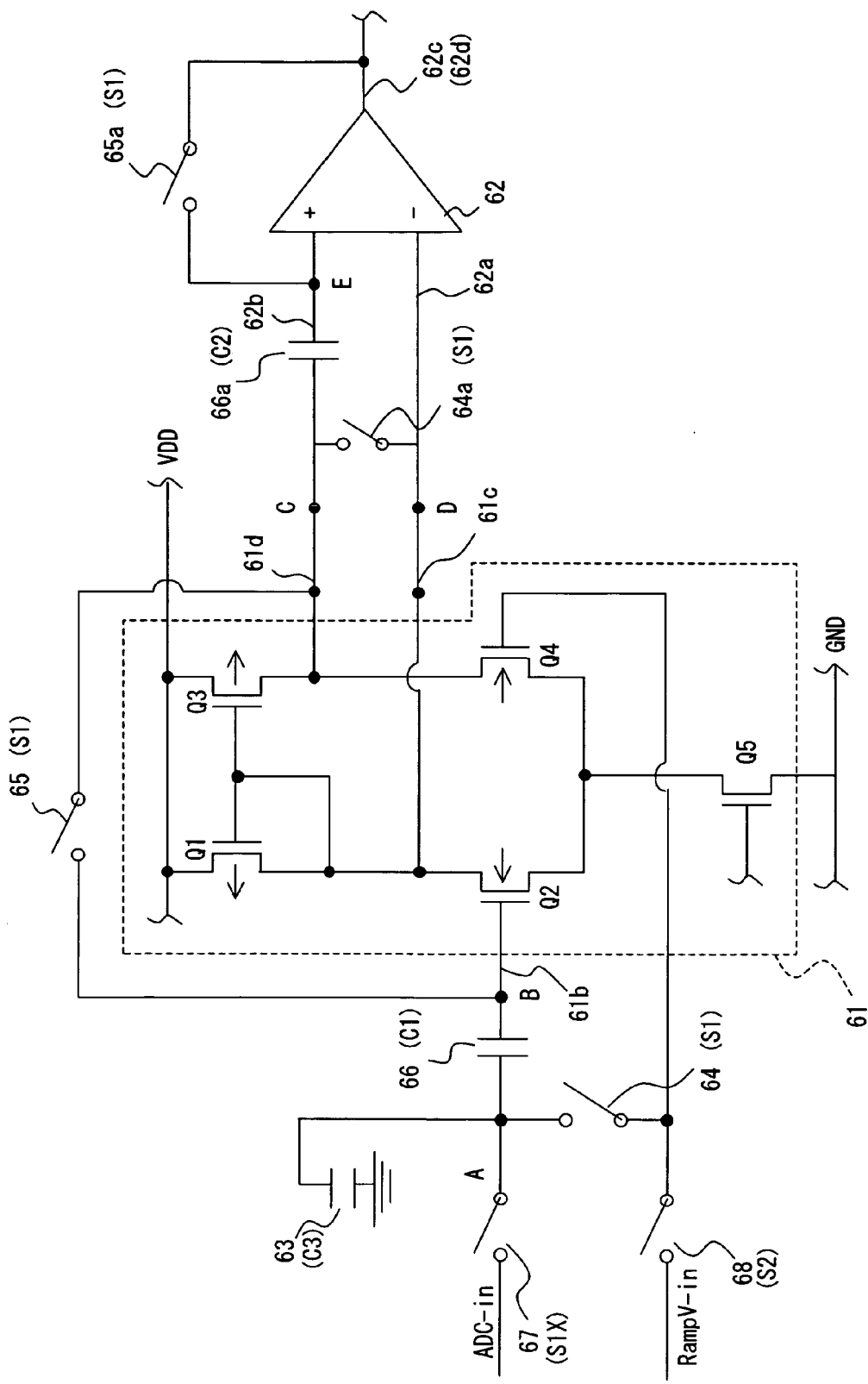
FIG. 4 is a circuit diagram showing in detail the internal configuration of the analog/digital converter apparatus including the differential comparator which is one preferred embodiment of the present invention.
Figure 5:
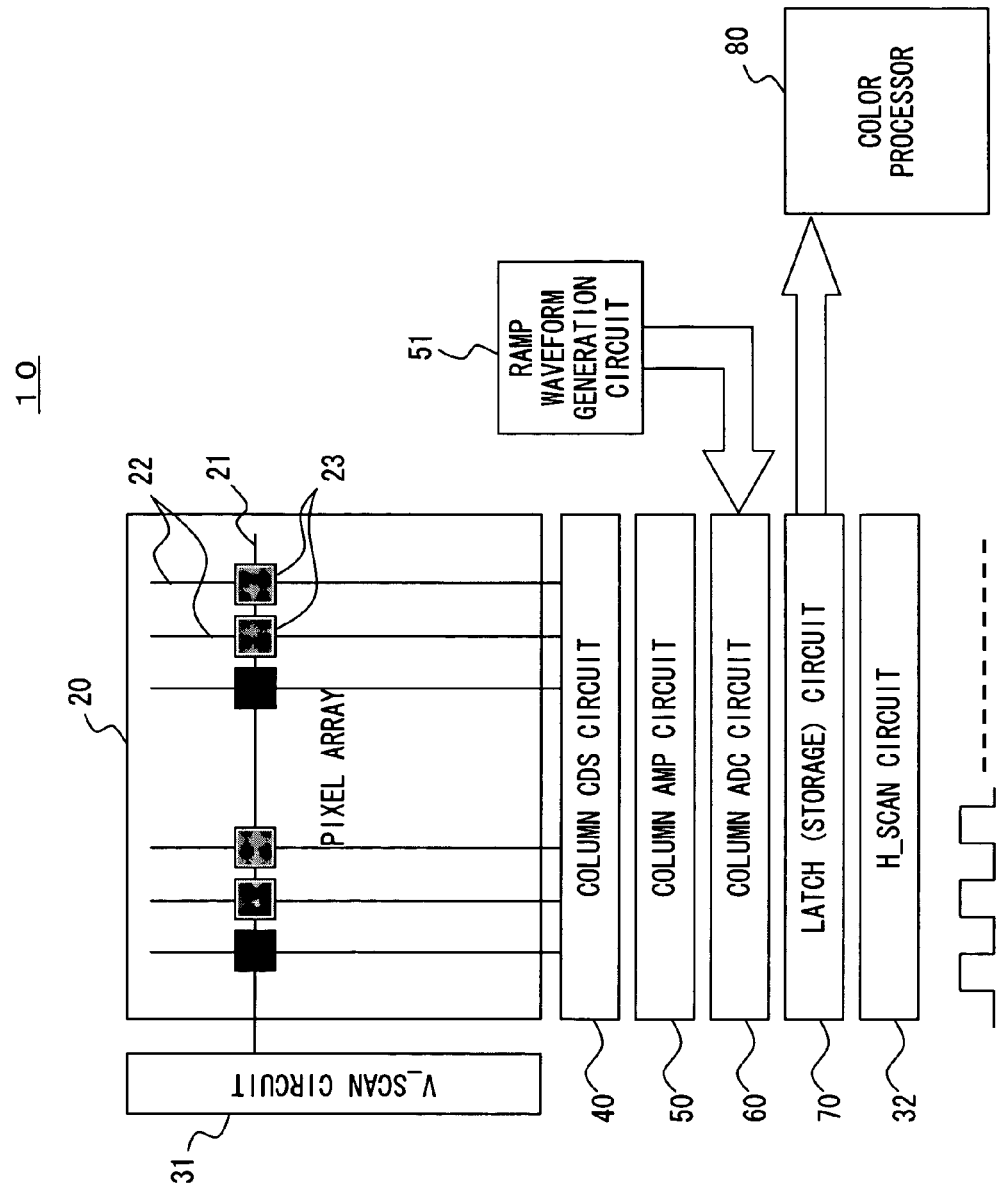
FIG. 5 is a block diagram showing one entire configuration of an imaging apparatus including the analog/digital converter apparatus including the differential comparator which is one preferred embodiment of the present invention.

FIG. 3 is a block diagram showing one configuration of an analog/digital converter apparatus including the differential comparator which is one preferred embodiment of the present invention. FIG. 4 is a circuit diagram showing in detail its internal configuration. FIG. 5 is a block diagram showing one entire configuration of an imaging apparatus including the analog/digital converter apparatus which is one preferred embodiment of the present invention.

The preferred embodiment is described using a case where the present invention is applied to an imaging apparatus 10 composed of, for example, a CMOS image sensor.

As shown in FIG. 5, the imaging apparatus 10 in this preferred embodiment comprises a pixel array 20 in which a plurality of pixel units 23 are two-dimensionally arrayed along each row 21 and each column 22, a vertical scan circuit 31 and a horizontal scan circuit 32.

Each pixel unit 23 is composed of, for example, a photo diode as a photoelectric conversion device, a transistor for initializing this photo diode, amplifying an output signal and controlling its timing and the like. Each pixel unit 23 is covered with a color filter with one of the three primary colors of light and converts light with each color from optical to electrical.

The vertical scan circuit 31 controls timing for selecting a plurality of pixel units of the pixel array 20 for each row. The horizontal scan circuit 32 controls timing for individually selecting each pixel unit 23 in the rows 21 for each column.

In this preferred embodiment, a column CDS circuit 40, a column AMP circuit 50, a column ADC circuit 60 (analog/digital converter apparatus) and a latch circuit 70 are provided for each column 22 of the pixel unit 23.

The column CDS circuit 40 eliminates noise generated when resetting a photoelectric conversion device in the pixel unit from an optical/electrical conversion signal by a correlation double sampling technology.

The column AMP circuit amplifies the optical/electrical conversion signal outputted from the column CDS circuit 40.

The column ADC circuit 60 digitizes the photoelectric conversion signal, using a ramp waveform signal RampV obtained from a ramp waveform generation circuit 51, which is described later.

The latch circuit 70 stores the photoelectric conversion signal after the digital conversion for each row 22 (pixel unit 23), and outputs the photoelectric conversion signal to a color processor 80 provided after it in synchronization with a horizontal scan signal outputted from the horizontal scan circuit 32.

The color processor 80 has a function to process the digital value of each photoelectric conversion signal of a pixel unit 23 corresponding to each color and to convert and output the photoelectric conversion signal into an image signal with an arbitrary standard, such as YUV, YCbCr, RGB or the like.

As shown in FIG. 3 as an example, the column ADC circuit 60 in this preferred embodiment comprises differential comparators 61 and 62 which are connected in double stages in order from the input side to the output side, and an inverter 69, which is inserted and connected between the output side of the differential comparator 62 and the latch circuit 70.

The reference signal input terminal 61a of the differential comparator 61 is connected to the ramp waveform generation circuit 51 via a switch 68 (switch S2) and a ramp waveform signal RampV is inputted.

To the analog signal input terminal 61b of the differential comparator 61, the photoelectric conversion signal 23a (ADC-in) is inputted from the pixel unit 23 via switch 67 (switch S1x). For this analog signal input terminal 61b, a capacitor device for signal 63 (capacitor device for signal C3) is provided in order to store the voltage level of the photoelectric conversion signal 23a.

The output terminals 61c and 61d of the differential comparator disposed at the former stage are connected to the input terminals 62a and 62b, respectively, of the differential comparator 62 disposed at the latter stage with the same positive/negative polarity.

In this preferred embodiment, the differential comparator 61 comprises an offset cancel function composed of a switch 64 (switch S1) (first switch) for controlling the short-circuiting of its reference signal input terminal 61a and the input terminal 62b, a switch 65 (switch S1) (second switch) for controlling the short-circuiting of the analog signal input terminal 61b and the output terminal 61d and a capacitor device 66 (capacitor device C1) (offset capacitor device) provided between the short-circuit position of the switch 64 in the analog signal input terminal 61b and the short-circuit position of the switch 65.

Similarly, the differential comparator 62 disposed at the latter stage comprises an offset cancel function composed of the switch 64a (switch S1) (first switch), the switch 65a (switch S1) (second switch) and the capacitor device 66a (capacitor device C2)(offset capacitor device).

As shown in FIG. 4, the differential comparator 61 comprises a pMOS transistor Q1, an nMOS transistor Q2, a pMOS transistor Q3, an nMOS transistor Q4 and an nMOS transistor Q5 for collecting and grounding these systems. The respective gates of the pMOS transistor Q1 and pMOS transistor Q3 of each system constitute a load resistance by being connected to the source side of the pMOS transistor Q1. To the gate of the nMOS transistor Q2, the analog signal input terminal 61b is connected. To the gate of the nMOS transistor Q4, the reference signal input terminal 61a is connected. The nMOS transistor Q5 functions as a constant current source.

Figure 6:
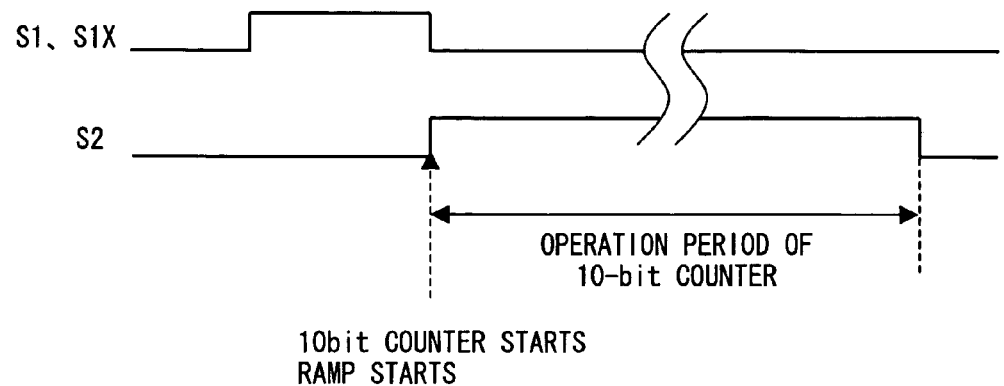
FIG. 6 is a timing chart showing one function of the imaging apparatus including the analog/digital converter apparatus which is one preferred embodiment of the present invention.
Figure 6:
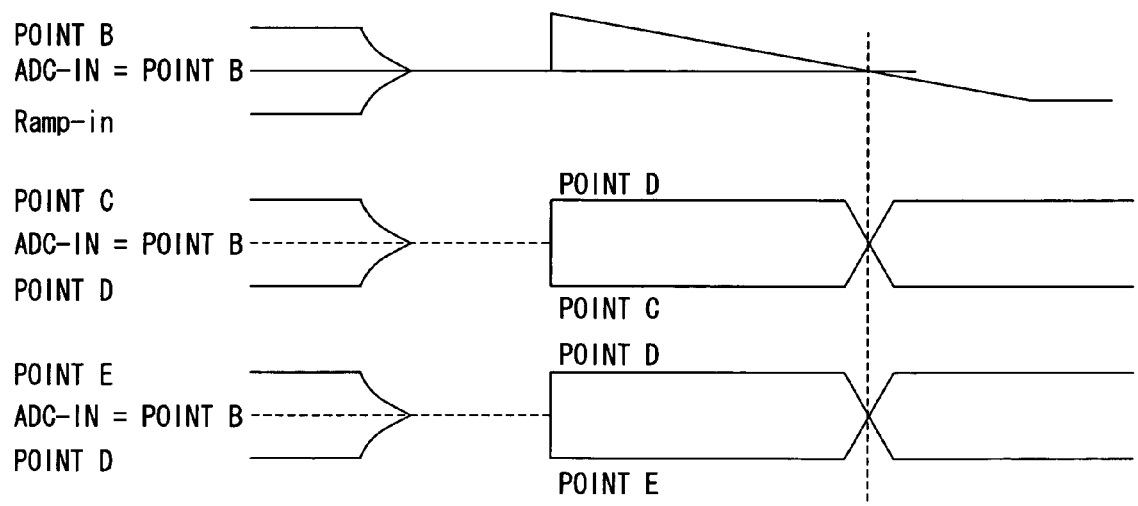

One function of this preferred embodiment is described below with reference to the diagram shown in FIG. 6 and the like.

Firstly, in the pixel array 20, each row 21 is selected by a vertical synchronous signal from the vertical scan circuit 31, and the photoelectric conversion device of the pixel unit 23 in the relevant row 21 is reset. Then, each pixel unit 23 (column 22) in the relevant row 21 is read by a horizontal synchronous signal (column selection output signal) from the horizontal scan circuit 32 one after another.

Then, reset noise and the like is eliminated from a photoelectric conversion signal 23a outputted from one pixel unit 23 (column 22) by the column CDS circuit 40, and the photoelectric conversion signal 23a is amplified by the column AMP circuit 50. Then, the photoelectric conversion signal 23a is inputted to the column ADC circuit 60 as ADC-in, and an analog/digital conversion process is applied to it to digitize it.

Specifically, in the column ADC circuit 60, the switches S1 and S1x are closed in synchronization with a column selection output signal, which is the input trigger of the photoelectric conversion signal 23a, and charge corresponding to the potential level of the arriving photoelectric conversion signal 23a is stored in the capacitor device for signal C3. Simultaneously, since the input/output sides of the differential comparator 61 (or the differential comparator 62) are short-circuited by the switch S1, charge corresponding to the potential of the photoelectric conversion signal 23a based on the level of the threshold voltage (operation point) of the differential comparator 61 (or the differential comparator 62) is stored in the capacitor device C1. Thus, potential between points A and E shown in FIG. 3 becomes the level of the photoelectric conversion signal 23a (ADC-in).

Then, when opening the switches S1 and S1x, closing the switch S2 and inputting a ramp waveform signal RampV to the reference signal input terminal 61a from the ramp waveform generation circuit, the respective potential of points C and D on the output side is inverted to potential the reverse in the case where the photoelectric conversion signal 23a has been inputted using the level of ADC-in, and count is started in the counter 71 by the inversion output of the inverter 69. Then, the moment a gradually decreasing ramp waveform signal RampV intersects with the voltage value of the photoelectric conversion signal 23a at point B, the respective potential between points C and E on the output sides of the differential comparators 61 and 62 is inverted, and the count value of the counter 71 is latched by the latch circuit 70 using the inversion output of the inverter 69. This count value is obtained by converting the photoelectric conversion signal 23a into a digital value with prescribed bit width.

Then, the digital data of the latch circuit 70 is outputted to and processed in the color processor in synchronization with a horizontal synchronous signal.

As described above, according to the present invention, the threshold voltage, parasitic capacitance and the like of the differential comparator 61 is cancelled by closing the switch S1 and storing the voltage of the photoelectric conversion signal 23a based on the threshold voltage of a transistor constituting the differential comparator 61 when closing the switch S1x and inputting the photoelectric conversion signal 23a. Therefore, potential point A is fixed. When opening the switches S1 and S1x, closing the switch S2, and inputting a ramp waveform signal RampV for comparison, no potential fluctuation at point B is generated due to the charge fluctuation of the capacitor device C1, and the photoelectric conversion signal 23a can be precisely compared with the ramp waveform signal RampV.

Accordingly, for example, no gradation, uneven color and the like of a photographed image is generated due to the uneven digital conversion of the photoelectric conversion signal 23a, and the image quality of the imaging apparatus 10 can be improved.

Since the differential comparator 61 is operated by the distribution of a specific current value determined by the nMOS transistor Q5 shared by each input system of the pMOS transistor Q1, nMOS transistor Q2, pMOS transistor Q3 and nMOS transistor Q4, there is no need to increase the current value to be controlled by the nMOS transistor Q5, and accordingly, consumption current can be suppressed. There is also neither need to increase the gate length of a transistor constituting the differential comparator 61 in order to control current nor parasitic capacitance increases.

Since the column ADC circuit 60 is provided each row 22, the number of column ADC circuits increases, for example, when the number or density of the pixel units in the pixel array 20 is increased in order to improve resolution. However, by suppressing the consumption current of each column ADC circuit, as in this preferred embodiment, a high-performance imaging apparatus 10 for outputting high-resolution pictures with high quality whose digitization accuracy in the column ADC circuit 60 is excellent can be realized with low consumption current (power).

The present invention is not limited to the above-mentioned preferred embodiment, and its variations and modifications are also possible as long as the subject matter of the present invention is not deviated.

According to the present invention, a differential comparator capable of realizing highly accurate analog/digital conversion with the lesser amount of consumption current can be provided.

An analog/digital conversion apparatus capable of realizing highly accurate analog/digital conversion with the lesser amount of consumption current can also be provided.

An imaging apparatus capable of outputting high-quality picture data with the lesser amount of consumption current can also be provided.

What is claimed is:

1. A differential comparator which outputs positive and/or negative logic signals to an output terminal according to the coincidence/non-coincidence of first and second input signal levels inputted to first and second input terminals, respectively, comprising
    an offset cancel function composed of an offset capacitor device provided on the differential comparator side of the first and second terminals,
    a first switch for short-circuiting the first and second input terminals in such a way as to form a closed loop including the offset capacitor device,
    a second switch for short-circuiting both the connection point between the offset capacitor device and the differential comparator, and the output terminal, and
    a capacitor device for signal, connected to the first input terminal to which an analog signal is inputted, for storing the analog signal.

2. The differential comparator according to claim 1, wherein
    said differential comparators are connected in multi-stages by inputting the positive and negative logic signals outputted from said differential comparator disposed at an early stage to the first and second input terminals disposed at a subsequent stage.

3. The differential comparator according to claim 1, which functions as an analog/digital converter for digitally converting an analog signal into a counter value of a counter for counting time from when the analog signal is inputted as a trigger until the level of the analog signal coincides with the level of the ramp waveform signal by inputting an analog signal to be converted from analog to digital to the first and second input terminals provided with said offset capacitor device, inputting a ramp waveform signal to said other second or first input terminal and controlling the on/off of the counter by the logic signal of the output terminal.

4. An analog/digital conversion apparatus which comprises a differential comparator which outputs positive and/or negative logic signals to an output terminal according to the coincidence/non-coincidence of the respective signal levels of the analog signal and reference signal inputted to first and second input terminals, respectively, and a counter whose start and stoppage is controlled by the logic signal and which outputs a value counted by a counter from when an analog signal is inputted as a trigger until the analog signal coincides with the reference signal, said differential comparator comprises an offset cancel function composed of an offset capacitor device provided on the differential comparator side of the first and second terminals, a first switch for short-circuiting the first and second input terminals in such a way as to form a closed loop including the offset capacitor device and a second switch for short-circuiting both the connection point between the offset capacitor device and the differential comparator, and the output terminal.

5. The analog/digital conversion apparatus according to claim 4, wherein said differential comparators are connected in multi-stages by inputting the positive and negative logic signals outputted from said differential comparator disposed at an early stage to the first and second input terminals disposed at a subsequent stage.

6. The analog/digital conversion apparatus according to claim 4, further comprising a capacitor device for signal, connected to the first input terminal to which the analog signal is inputted, for storing the analog signal.

7. The analog/digital conversion apparatus according to claim 4, wherein said reference signal is a ramp waveform signal.

8. An imaging apparatus which comprises reading circuits each composed of a pixel array, a plurality of pixel units of which, including an photoelectric conversion device are two-dimensionally arrayed in the row and column directions, and an analog/digital converter for converting an optical/electrical conversion signal outputted from each pixel unit into a digital signal, said analog/digital converter comprises a differential comparator for outputting positive and/or negative logic signals to an output terminal according to the coincidence/non-coincidence of the respective signal levels of the analog signal and reference signal inputted to first and second input terminals, respectively; and an offset cancel function composed of an offset capacitor device provided on the first terminal, a first switch for short-circuiting the first and second input terminals in such a way as to form a closed loop including the offset capacitor device, and a second switch for short-circuiting both the output terminal and the first input terminal provided with the offset capacitor device.

9. The imaging apparatus according to claim 8, wherein said analog/digital converter further comprises a counter for outputting time from when the analog signal is inputted as a trigger until the level of the analog signal coincides with the level of the reference signal as the digital conversion value of the analog signal by controlling its start and stoppage by the logic signal.

10. The imaging apparatus according to claim 8, wherein in said analog/digital converter, said differential comparators are provided in multi-stages by inputting positive and negative logic signals from said differential comparator disposed at an early stage to the first and second input terminals of said differential comparator at a subsequent stage.

11. The imaging apparatus according to claim 8, wherein said reading circuit further comprises a noise elimination circuit disposed before said analog/digital converter, for eliminating noise included in the photoelectric conversion signal by correlation double sampling.

12. The imaging apparatus according to claim 8, wherein said reading circuit is provided for each row or column of said pixel unit.

13. The imaging apparatus according to claim 8, wherein said reference signal is a ramp waveform signal.

14. The imaging apparatus according to claim 8, which is a CMOS image sensor.

* * * * *